(12) United States Patent
Brown et al.

(10) Patent No.: US 8,125,815 B2
(45) Date of Patent: Feb. 28, 2012

(54) TRANSISTOR BIT CELL ROM ARCHITECTURE

(75) Inventors: Jeffrey S. Brown, Fort Collins, CO (US); Mark F. Turner, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 110 days.

(21) Appl. No.: 12/337,880

(22) Filed: Dec. 18, 2008

(65) Prior Publication Data

US 2010/0157649 A1 Jun. 24, 2010

(51) Int. Cl.
*G11C 17/00* (2006.01)

(52) U.S. Cl. ........ 365/104; 365/103; 365/174; 365/186; 365/189.15; 365/189.02; 365/230.02; 365/94; 365/233.17

(58) Field of Classification Search .................. 365/104, 365/103, 174, 186, 189.16, 189.15, 189.02, 365/230.02, 94, 233.17
See application file for complete search history.

(56) References Cited

U.S. PATENT DOCUMENTS

| | | | |
|---|---|---|---|
| 6,363,001 B1 | 3/2002 | Borot et al. | |
| 6,430,078 B1 * | 8/2002 | Meier et al. | ................... 365/104 |
| 6,567,294 B1 | 5/2003 | Yochum | |
| 6,642,587 B1 | 11/2003 | Poplevine et al. | |
| 6,922,349 B2 | 7/2005 | Barry et al. | |
| 7,126,866 B1 | 10/2006 | Poplevine et al. | |
| 7,603,513 B2 * | 10/2009 | Stephani | ........................ 711/108 |
| 7,646,622 B2 * | 1/2010 | Paul | ................................. 365/94 |
| 2005/0258492 A1 * | 11/2005 | Chaudhry et al. | ............. 257/369 |
| 2008/0137466 A1 * | 6/2008 | Nakamura | ..................... 365/227 |
| 2009/0207644 A1 * | 8/2009 | Paul | ................................. 365/94 |

* cited by examiner

*Primary Examiner* — Fernando Hidalgo
(74) *Attorney, Agent, or Firm* — Samuel M. Freund; Christopher P. Whitham; Cochran Freund & Young LLP

(57) ABSTRACT

An apparatus and method for providing a read-only memory (ROM) bit cell having one each of a PMOS transistor and an NMOS transistor, which has reduced static and dynamic electric power losses, are described. In particular, the bit cell does not require a pre-charge transistor. The sense amplifier for determining the voltages on ROM bit lines may be a digital inverter, address decoding may be simplified since there are no timing requirements with respect to transistor pre-charge, and chips containing a plurality of ROM bit cell may be readily programmed. In one embodiment of the invention, each bit cell includes one PMOS transistor having its source in electrical connection with a voltage source, its drain connected or unconnected to a bit line, and its gate connected to an inverted version of the word line signal; and one NMOS transistor having its source connected to a lower voltage source, its drain connected or disconnected to the bit line, and its gate connected to the word line. The bit cell is programmed during the ROM generation by connecting the drain of either the PMOS (logic level 1) or the NMOS (logic level 0) to the bit line.

20 Claims, 2 Drawing Sheets

TRANSISTOR BIT CELL ROM ARCHITECTURE

FIELD OF THE INVENTION

The present invention relates generally to read-only memory (ROM) cells and ROM architecture and, more particularly, to a transistor-based read only memory bit cell having low power consumption.

BACKGROUND OF THE INVENTION

Power consumption in integrated circuits is becoming a significant design criterion since modern chips contain a greater number transistors having increased processing power. Such high-performance transistors leak current, causing static power losses. Further, when such transistors process data, capacitive loads are charged and discharged, causing dynamic power losses or switching power loss. The static power consumption of such circuits tends to increase if no precautions are taken, which is especially important if devices are battery powered. Traditionally, transistor-based, read-only memory (ROM) chips were designed to achieve a tiny area for each memory element in order to generate more memory storage on an integrated circuit chip. Power and performance were sought, but size was the primary design criterion. Presently, there are situations where a larger area memory element may be desirable if power consumption can be reduced without sacrificing performance.

A ROM array is programmed with a combination of ones and zeros during the manufacture of an integrated circuit, and memory cells or bit cells may be arrayed in rows and columns, each bit cell being associated with one row line and one column line. Once a transistor-based, read-only memory (ROM) device has been programmed, the data stored therein is fixed and may be read, but cannot be changed. Prior to reading one or more memory cells in the array, all column lines are typically pre-charged high; that is, a voltage corresponding to a logical 1 is provided to the column lines.

Power consumption may be reduced in traditional ROM designs by: (a) reducing the transistor channel width, increasing transistor channel length, and raising the $V_t$ (threshold voltage) of the transistors to reduce the static current, although at the expense of transistor performance; (b) latching (storing) the output data, gating the clock and shutting off the sense amplifier bias current to eliminate clock switching power and static bias current during inactive periods; this requires chip enable controls; and (c) reducing the sense amplifier bias current to reduce the static power at the expense of the sense amplifier response time (performance). Procedure (a) may be implemented using any transistor architecture. Methods (b) and (c) are not applicable in situations where sense amplifiers are not employed. Disadvantages of these procedures include that the gating clock and bias current require control by an external circuit, thereby adding size, complexity and power consumption.

U.S. Pat. No. 6,363,001 for "ROM With A Reduced Static Consumption," which issued to Bertrand Borot and Stephane Hanriat on Mar. 26, 2002, and U.S. Pat. No. 6,567,294 for "Low Power Pre-Charge High ROM Array," which issued to John A. Yochum on May 20, 2003, also address this issue.

FIG. 1 is a schematic representation of two PRIOR ART transistor ROM bit cells, 10, including a pre-charge transistor and a differential sense amplifier for determining the logic output thereof. During fabrication, the NMOS transistor of each bit cell, 12 and 14, may be programmed to output a logical 0 or a logical 1 output, respectively, by having the drain thereof either electrically detached from bit line, 16, or attached thereto, respectively. The content of a bit cell may be read by providing signals to the associated word lines, WL0, 18, or WL1, 20, connected to the gates of the transistors, and measuring the resulting voltage, 22, of bit line 16 using inverting sense amplifier, 24.

Bit line 16 is first pre-charged high by providing a low pre-charge signal, 26, to the gate of PMOS pull-up transistor, 28, which turns on the transistor. Transistor 28 has its source in electrical connection with voltage supply, 30, having a voltage $V_{dd}$, and its drain in electrical connection with bit line 16. Transistor 28 is then turned off by providing a high pre-charge signal 26, and bit line 16 remains charged high. It should be mentioned that even if neither transistor in bit cell 12 and bit cell 14 is turned on, there exists a leakage current path between $V_{dd}$ and lower potential, $V_{ss}$, supplied by voltage supply, 31, through pre-charge transistor 28 and each transistor (in this case, the transistor in bit cell 14) in electrical contact with bit line 16.

A voltage 18 corresponding to a logical 1 is applied to the gate of the transistor in bit cell 12 for which there is no connection between the transistor and the bit line; therefore, bit line 16 remains charged. If a nonzero reference voltage, 32, is applied to differential sense amplifier 24, a voltage corresponding to a logical 0 will appear at output 22 thereof. A voltage 20 corresponding to a logical 1 is subsequently applied to the gate of the transistor in bit cell 14, having its drain connected to bit line 16 and its source connected to low voltage $V_{ss}$ (which may be at ground potential). The voltage on bit line 16 will be discharged, and differential sense amplifier 24 will generate an output 22 corresponding to a logical 1. Thus, bit cell 12 generates a logical 0 and bit cell 14 generates a logical 1.

SUMMARY OF THE INVENTION

Accordingly, it is an object of the present invention to provide a transistor bit cell for read-only memory applications having reduced static and dynamic power losses.

Another object of the invention is to provide a transistor bit cell for read-only memory applications that does not require pre-charging of the bit lines.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the read-only memory bit cell, hereof, includes in combination: a PMOS transistor having the source thereof maintained at a voltage $V_{dd}$; an NMOS transistor having the source thereof maintained at a voltage $V_{ss}$, where $V_{dd} > V_{ss}$; wherein, when the PMOS transistor receives a voltage corresponding to a logic level 0 on the gate thereof and the drain thereof is in electrical contact with a bit line, while the drain of the NMOS transistor is not in electrical contact with the bit line, the bit line is charged to a voltage corresponding to a logic level 1; and wherein, when the NMOS transistor receives a voltage corresponding to a logic level 1 on the gate thereof and the drain thereof is in electrical contact with the bit line, while the drain of the PMOS transistor is not in electrical contact with the bit line, the bit line is discharged to a voltage corresponding to a logic level 0.

In another aspect of the present invention, in accordance with its objects and purposes, the method for programming a read-only memory bit cell, hereof, includes: providing a PMOS transistor having the source thereof maintained at a voltage $V_{dd}$; providing an NMOS transistor having the source thereof maintained at a voltage $V_{ss}$, where $V_{dd} > V_{ss}$; whereby a bit line is charged to a voltage corresponding to a logic level 1 when a voltage corresponding to a logic level 0 is provided to the gate of the PMOS transistor and the drain thereof is placed in electrical contact with the bit line, while the drain of said NMOS transistor is not in electrical contact with the bit line; and whereby the bit line is discharged to a voltage corresponding to a logic level 0 when the a voltage corresponding to a logic level 1 is provided to the gate of the NMOS transistor and the drain thereof is in electrical contact with the bit line, while the drain of the PMOS transistor is not in electrical contact with the bit line.

In still another embodiment of the invention, and in accordance with its objects and purposes, the read-only memory bit cell, hereof, includes in combination: a PMOS transistor having the drain thereof in electrical contact with a bit line; a NMOS transistor having the drain thereof in electrical contact with the bit line; wherein, when the PMOS transistor receives a voltage corresponding to a logic zero on the gate thereof and the source thereof is maintained at a voltage $V_{dd}$, while the source of the NMOS transistor is unconnected, the bit line is pulled up to a voltage corresponding to a logic level 1; and wherein, when the NMOS transistor receives a voltage corresponding to a logic level 1 on the gate thereof and the source thereof is maintained at a voltage $V_{ss}$, where $V_{dd} > V_{ss}$, while the source of the PMOS transistor is unconnected, the bit line is discharged to a voltage corresponding to a logic level 0.

In yet another aspect of the invention, and in accordance with its objects and purposes, the method for programming a read-only memory bit cell, hereof, includes: providing a PMOS transistor having the drain thereof in electrical connection with a bit line; providing an NMOS transistor having the drain thereof in electrical connection with the bit line; whereby the bit line is charged to a voltage corresponding to a logic level 1 when a voltage corresponding to a logic level 0 is provided to the gate of the PMOS transistor and the source thereof is maintained at a voltage $V_{dd}$, while the source of the NMOS transistor is unconnected; and whereby the bit line is discharged to a voltage corresponding to a logic level 0 when the a voltage corresponding to a logic level 1 is provided to the gate of the NMOS transistor and the source thereof is maintained at a voltage $V_{ss}$, where $V_{dd} > V_{ss}$, while the source of the PMOS transistor is unconnected.

Benefits and advantages of the present invention include, but are not limited to, providing a two-transistor ROM bit cell which has reduced static and dynamic electric power losses, for which a sense amplifier for reading the bit lines may be replaced by a digital inverter, for which address decoding is simplified since there are no timing requirements with respect to pre-charge transistors (which have been eliminated), and chips containing a plurality of ROM bit cell are readily programmed.

BRIEF DESCRIPTION OF THE DRAWINGS

The accompanying drawings, which are incorporated in and form a part of the specification, illustrate two embodiments of the apparatus of the present invention and, together with the description, serve to explain the principles of the invention. In the drawings:

FIG. 2A is a schematic representation of one embodiment of two bit cells of the two-transistor bit cell ROM architecture of the present invention, including an inverter for determining the logic output thereof, while

DETAILED DESCRIPTION OF THE INVENTION

Briefly, the present invention includes an apparatus and method for providing a ROM bit cell having one each of a PMOS and NMOS transistor, which has reduced static and dynamic electric power losses, for which a sense amplifier for determining the voltages on bit lines can be replaced by a digital inverter, for which address decoding may be simplified since there are no timing requirements with respect to pre-charge transistors (which have been eliminated), and chips containing a plurality of ROM bit cells are readily programmed. In particular, no pre-charge transistor is required for the bit cell.

Each bit cell includes one PMOS transistor having its source in electrical connection with a voltage source, its drain connected or unconnected to a bit line, and its gate connected to an inverted version of the word line signal; and one NMOS transistor having its source connected to a lower voltage source, its drain connected or disconnected to the bit line, and its gate connected to the word line. The bit cell is programmed during the ROM generation by connecting the drain of either the PMOS (logic level 1) or the NMOS (logic level 0) to the bit line.

As stated, since no pre-charge is required, overall address decode is simplified and recurring clock-generated power losses are eliminated. Differential amplifiers may be replaced by digital inverters as sense amplifiers, eliminating static bias current and eliminating the requirement for latching the output bit line data.

ROM bit cell design may be implemented using standard cell library elements, and designs may be generated and analyzed using standard digital ASIC design tools as a result of simplified timing requirements and the elimination of analog design analysis. This permits easier integration into integrated circuit (IC) designs than traditionally compiled ROMs.

Bit cell area and power may be traded off against one another in order to optimize the design by adjusting the sizes of the gates, or by choosing longer channel gate lengths, or choosing different $V_t$ transistors, all available in a modern cell library.

Figure 2A:
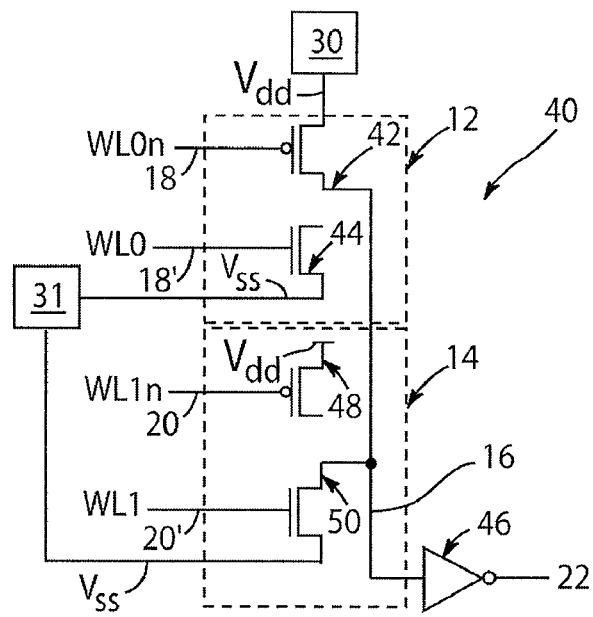

Reference will now be made in detail to the present embodiments of the present invention, examples of which are illustrated in the accompanying drawings. Similar or identical structure is identified using identical reference characters. Turning now to the FIGURES, FIG. 2A is a schematic representation of one embodiment of two bit cells 12 and 14 of the two-transistor bit cell read-only memory (ROM) architecture, 40, of the present invention including an inverter for determining the logic output thereof. Bit cell 12 includes 2 transistors, PMOS transistor, 42, and NMOS transistor, 44, with the voltage supply 30 at $V_{dd}$ being connected to the source of transistor 42, and bit line 16 being attached to the drain. Voltages 18 and 18', corresponding to the complement of a logical 1 and a logical 1, respectively, are simultaneously applied to the gate of each transistor of bit cell 12. Transistor 42 turns on, charging bit line 16 to a logical 1, the output 22 from inverter, 46, being a logical 0. Inverter 46 may be a CMOS inverter, and latching is not required if the input address is held at a fixed value for the duration of the clock cycle. Transistor 44 is not connected to bit line 16, thereby not impacting the logic level of bit line 16. In the case of bit cell 14, there is no connection between the drain of PMOS transistor, 48, and bit line 16; therefore, bit line 16 remains unaffected when voltage, 20, corresponding to the complement of a logical 1 is applied to the gate thereof. When voltage 20' corresponding to a logical 1 is applied to the gate of transistor, 50, any charge on bit line 16 is drained to $V_{ss}$, and a voltage corresponding to a logical 0 is measured thereon by inverter 46, which generates a logical 1 output. Thus, bit cell 12 generates a logical 0, and bit cell 14 generates a logical 1 without the use of a pre-charge transistor. When the complement of the equivalent of a zero logic level is applied to transistors 42 and 48, these transistors remain off and power consumption is expected to be low since inverter 46 and transistor 44 and 50 are not exposed to $V_{dd}$.

Figure 2B:
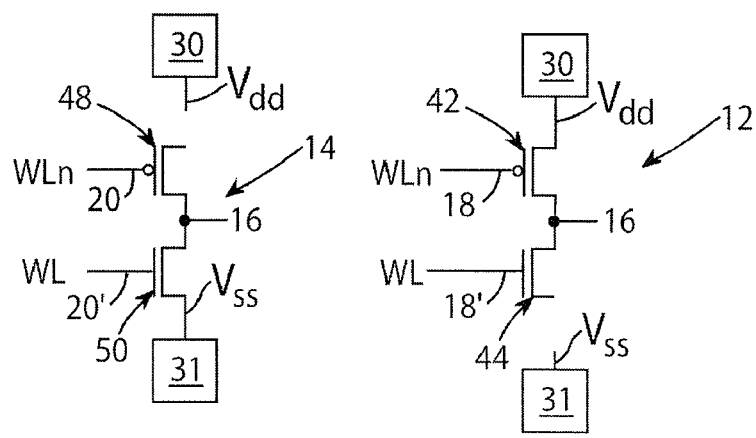
FIG. 2B is a schematic representation of another embodiment of two bit cells of the two-transistor bit cell ROM architecture hereof.

FIG. 2B is a schematic representation of another embodiment of two bit cells 12 and 14 of the two-transistor bit cell read-only memory (ROM) architecture of the present invention. Again, bit cell 12 includes 2 transistors, PMOS transistor, 42, and NMOS transistor, 44, with the voltage supply 30 at $V_{dd}$ being connected to the source of transistor 42, and bit line 16 being attached to the drain thereof. The source of transistor 44 is not attached to voltage $V_{ss}$. Voltages 18 and 18', corresponding to the complement of a logical 1 and a logical 1, respectively, are applied to the gate of each transistor of bit cell 12. Transistor 42 turns on, charging bit line 16 to a logical 1. The drain of transistor 44 is connected to bit line 16, but the source is not connected to $V_{ss}$, thereby not impacting the logic level of bit line 16. In the case of bit cell 14, there is no connection between the source of PMOS transistor, 48, and voltage source 30. However, the drain of transistor 48 is attached to bit line 16 and the drain of transistor 50. Therefore, bit line 16 remains unaffected when voltage, 20, corresponding to the complement of a logical 1 is applied to the gate of transistor 48, while when voltage 20' corresponding to a logical 1 is simultaneously applied to the gate of transistor, 50, any charge on bit line 16 is drained to $V_{ss}$, and a voltage corresponding to a logical 0 may be measured thereon. Thus, if an inverter is used to determine voltages on bit line 16, bit cell 12 generates a logical 0, and bit cell 14 generates a logical 1 without the use of a pre-charge transistor.

Since each transistor is connected to bit line 16 in this embodiment of the invention, it is expected that dynamic power consumption may be higher than the embodiment illustrated in FIG. 2A hereof.

Figure 1:
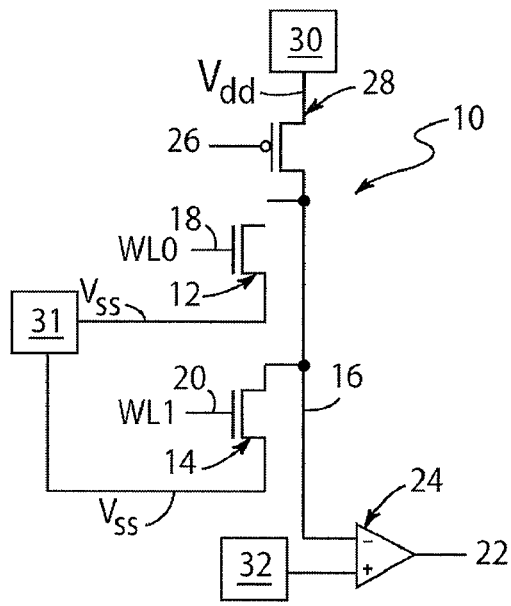
FIG. 1 is a schematic representation of two PRIOR ART transistor ROM bit cells including a pre-charge transistor and a differential sense amplifier for determining the logic output thereof.
Figure 3:
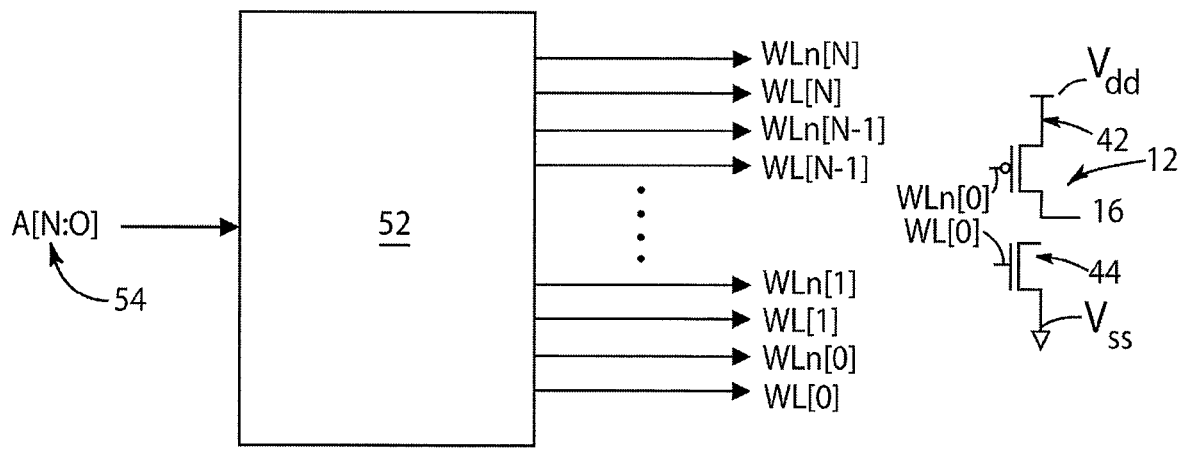
FIG. 3 is a schematic representation of an address bus module for generating the word line signals for the bit cells shown in FIGS. 2 and 3 hereof.

FIG. 3 is a schematic representation of an address bus module (also referred to as an address code module), 52, for generating the word line signals for the bit cells shown in FIGS. 2 and 3 hereof. Simple binary addresses are translated into the gated voltages, for example, 18, 18', 20, and 20', in FIG. 2A, for controlling which of the bit cell transistors actively drives bit line 16. Simple Boolean logic converts the binary N bit address into a bus of $2^N$ decoded word line signals ("sometimes called a binary to one of many decoder") for each of: WLn[M-1:0] and WL[M-1:0]. Address bus, A[N-1:0], 54, identifies the particular bit cell being read. Decoded signals have one active signal at any time (particularly for the bit cell described in FIG. 1 hereof). As required in FIG. 2A, the decoder may supply the compliment of the decoded signal bus.

Figure 4:
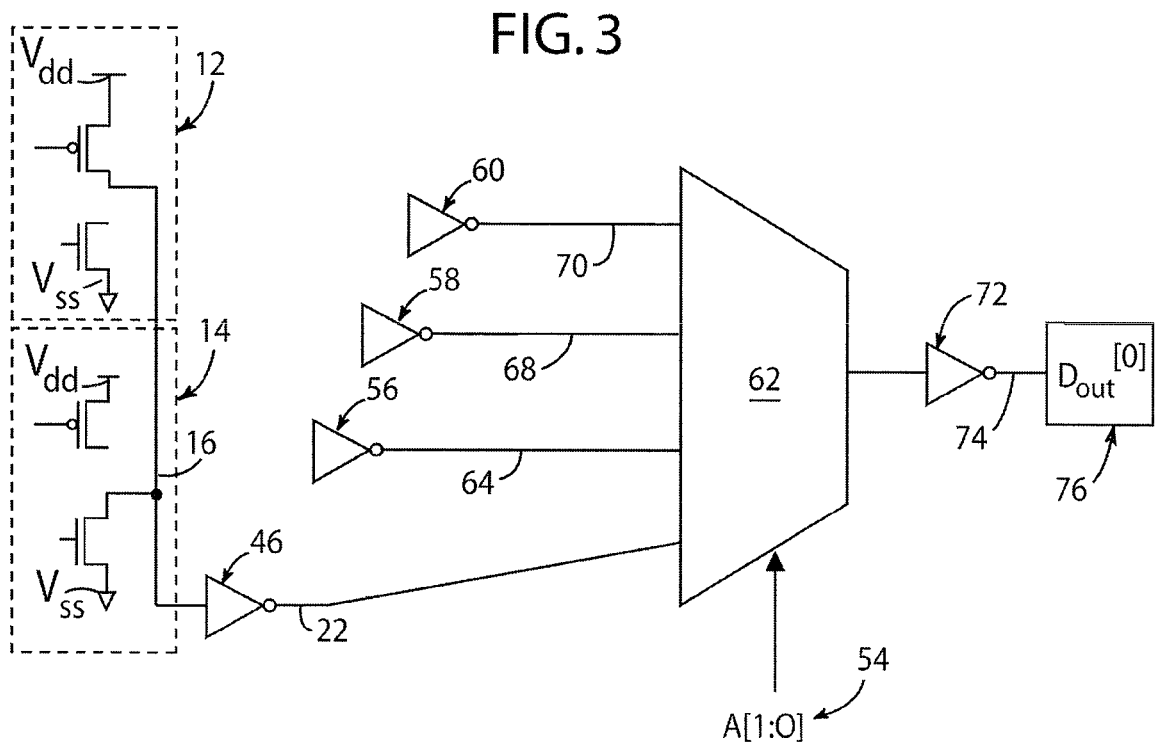
FIG. 4 is a schematic representation of a plurality of bit cells illustrated in FIG. 2A, hereof, connected to common bit line and read using sense amplifiers which may be multiplexed and further amplified.

FIG. 4 is a schematic representation of a plurality of bit cells, as an example, showing bit cells 12 and 14 of FIG. 2A, hereof connected to common bit line 16 and read using sense amplifier 46, which may be an inverter. In the situation where there is column decoding, a multiplicity of sense amplifiers, 56, 58, and 60, may be employed to receive signals from other bit lines. Although in principle any number, N, of columns may be decoded using an N:1 multiplexer, 4:1 column decode multiplexer, 62, directed by address bus 54, receives outputs 22, 64, 68, and 70, which may be further amplified by sense amplifier, 72, the output, 74, of which is directed to data output bus, 76.

One of the advantages of the embodiments of the present invention is programmability. As an example, last minute design changes prior to release of a design in the situation where synthesized logic is employed would be costly since many processing layers would be involved. Similar to other ROM cells, embodiments of the present invention for both the "0" and "1" bit cells may be different on only one processing layer such that the cost associated with data changes (exchanging a "1" for a "0") will be minimal since the routing will not have to be altered.

The two-transistor bit cells hereof may be contact or diffusion programmed with the same effect.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A read-only memory bit cell that has two memory storage bit configurations, a logic level 1 configuration and a logic level 0 configuration, comprising in combination:

a PMOS transistor having the source thereof maintained at a voltage $V_{dd}$;

an NMOS transistor having the source thereof maintained at a voltage $V_{ss}$, where $V_{dd} > V_{ss}$;

wherein, when said read-only memory bit cell is configured in said logic level 1 configuration, the drain of said PMOS transistor is in electrical contact with a bit line and the drain of said NMOS transistor is unconnected and is, accordingly, not in electrical contact with said bit line such that when said PMOS transistor receives a voltage corresponding to a logic 0 on the gate thereof, said bit line is pulled up to a voltage corresponding to a logic level 1;

wherein, when said read-only memory bit cell is configured in said logic level 0 configuration, the drain of said PMOS transistor is unconnected and is, accordingly, not in electrical contact with said bit line and the drain of said NMOS transistor is in electrical contact with said bit line such that when said NMOS transistor receives a voltage corresponding to a logic level 1 on the gate thereof, said bit line is discharged to a voltage corresponding to a logic level 0; and wherein said read-only memory bit cell includes only said PMOS transistor and said NMOS transistor.

2. The apparatus of claim 1, wherein said bit line is read using a sense amplifier.

3. The apparatus of claim 2, wherein said sense amplifier comprises an inverter.

4. The apparatus of claim 3, wherein said inverter comprises a CMOS inverter.

5. The apparatus of claim 1, wherein said voltage corresponding to said logic level 0 on the gate of said PMOS transistor and said voltage corresponding to said logic level 1 on the gate of said NMOS transistor are derived from complimentary word line and word line signals, respectively.

6. A method for programming a read-only memory bit cell to one of two memory storage bit configurations, a logic level 1 configuration or a logic level 0 configuration, comprising:
providing a PMOS transistor having the source thereof maintained at a voltage $V_{dd}$;
providing an NMOS transistor having the source thereof maintained at a voltage $V_{ss}$, where $V_{dd} > V_{ss}$;
when said read-only memory bit cell is being programmed to said logic level 1 configuration, connecting the drain of said PMOS transistor to be in electrical contact with a bit line, while the drain of said NMOS transistor is unconnected and is, accordingly, not in electrical contact with said bit line such that said bit line is charged to a voltage corresponding to a logic level 1 when a voltage corresponding to a logic level 0 is provided to the gate of said PMOS transistor;
when said read-only memory bit cell is being programmed to said logic level 0 configuration, connecting the drain of said NMOS transistor to be in electrical contact with said bit line, while the drain of said PMOS transistor is unconnected and is, accordingly, not in electrical contact with said bit line such that said bit line is discharged to a voltage corresponding to a logic level 0 when a voltage corresponding to a logic level 1 is provided to the gate of said NMOS transistor; and
wherein said read-only memory bit cell includes only said PMOS transistor and said NMOS transistor.

7. The method of claim 6, wherein said bit line is read using a sense amplifier.

8. The method of claim 7, wherein said sense amplifier comprises an inverter.

9. The method of claim 8, wherein said inverter comprises a CMOS inverter.

10. The method of claim 6, wherein said voltage corresponding to said logic level 0 on the gate of said PMOS transistor and said voltage corresponding to the logic level 1 on the gate of said NMOS transistor are derived from complimentary word line and word line signals, respectively.

11. A read-only memory bit cell that has two memory storage bit configurations, a logic level 1 configuration and a logic level 0 configuration, comprising in combination:
a PMOS transistor having the drain thereof in electrical contact with a bit line;
a NMOS transistor having the drain thereof in electrical contact with said bit line;
wherein, when said read-only memory bit cell is configured in said logic level 1 configuration, the source of said PMOS transistor is maintained at a voltage $V_{dd}$ and the source of said NMOS transistor is unconnected such that when said PMOS transistor receives a voltage corresponding to a logic zero on the gate thereof, said bit line is pulled up to a voltage corresponding to a logic level 1;
wherein, when said read-only memory bit cell is configured in said logic level 0 configuration, the source of said PMOS transistor is unconnected and, the source of said NMOS transistor is maintained at a voltage $V_{ss}$, where $V_{dd} > V_{ss}$, such that when said NMOS transistor receives a voltage corresponding to a logic level 1 on the gate thereof, said bit line is discharged to a voltage corresponding to a logic level 0; and
wherein said read-only memory bit cell includes only said PMOS transistor and said NMOS transistor.

12. The apparatus of claim 11, wherein said bit line is read using a sense amplifier.

13. The apparatus of claim 12, wherein said sense amplifier comprises an inverter.

14. The apparatus of claim 13, wherein said inverter comprises a CMOS inverter.

15. The apparatus of claim 11, wherein said voltage corresponding to said logic level 0 on the gate of said PMOS transistor and said voltage corresponding to said logic level 1 on the gate of said NMOS transistor are derived from complimentary word line and word line signals, respectively.

16. A method for programming a read-only memory bit cell to one of two memory storage bit configurations, a logic level 1 configuration or a logic level 0 configuration, comprising:
providing a PMOS transistor having the drain thereof in electrical connection with a bit line;
providing an NMOS transistor having the drain thereof in electrical connection with said bit line;
when said read-only memory bit cell is being programmed to said logic level 1 configuration, connecting the source of said PMOS transistor so the source of said PMOS transistor is maintained at a voltage $V_{dd}$, while the source of said NMOS transistor is unconnected such that said bit line is charged to a voltage corresponding to a logic level 1 when a voltage corresponding to a logic level 0 is provided to the gate of said PMOS transistor;
when said read-only memory bit cell is being programmed to said logic level 0 configuration, connecting the source of said NMOS transistor so the source of said NMOS transistor is maintained at a voltage $V_{ss}$, where $V_{dd} > V_{ss}$, while the source of said PMOS transistor is unconnected such that said bit line is discharged to a voltage corresponding to a logic level 0 when a voltage corresponding to a logic level 1 is provided to the gate of said NMOS transistor; and
wherein said read-only memory bit cell includes only said PMOS transistor and said NMOS transistor.

17. The method of claim 16, wherein said bit line is read using a sense amplifier.

18. The method of claim 17, wherein said sense amplifier comprises an inverter.

19. The method of claim 18, wherein said inverter comprises a CMOS inverter.

20. The method of claim 16, wherein said voltage corresponding to said logic level 0 on the gate of said PMOS transistor, and said voltage corresponding to said logic level 1 on the gate of said NMOS transistor are derived from complimentary word line and word line signals, respectively.

* * * * *